(12) United States Patent
Sharma et al.

(10) Patent No.: US 12,131,909 B2
(45) Date of Patent: Oct. 29, 2024

(54) SELECTIVE PROCESSING WITH ETCH RESIDUE-BASED INHIBITORS

(71) Applicant: Lam Research Corporation, Fremont, CA (US)

(72) Inventors: Kashish Sharma, Tigard, OR (US); Taeseung Kim, Fremont, CA (US); Samantha S. H. Tan, Newark, CA (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/485,749

(22) Filed: Oct. 12, 2023

(65) Prior Publication Data
US 2024/0038539 A1 Feb. 1, 2024

Related U.S. Application Data

(63) Continuation of application No. 15/733,366, filed as application No. PCT/US2019/013640 on Jan. 15, 2019, now Pat. No. 11,823,909.
(Continued)

(51) Int. Cl.
*H01L 21/285* (2006.01)
*C23C 16/04* (2006.01)
(Continued)

(52) U.S. Cl.
CPC ........ *H01L 21/28562* (2013.01); *C23C 16/04* (2013.01); *C23C 16/06* (2013.01);
(Continued)

(58) Field of Classification Search
CPC ... C23C 16/04; H01L 21/02639–02645; H01L 21/28562; H01L 21/4763–47635
See application file for complete search history.

(56) References Cited

U.S. PATENT DOCUMENTS 10,378,105 B2   8/2019   Yu et al.
10,577,691 B2   3/2020   Nowak et al.
(Continued)

FOREIGN PATENT DOCUMENTS

CN    101809187 A    8/2010
CN    107112207 A    8/2017
(Continued)

OTHER PUBLICATIONS

International Preliminary Report on Patentability dated Jul. 30, 2020 in PCT Application PCT/US2019/013640.
(Continued)

*Primary Examiner* — Daniel P Shook
(74) *Attorney, Agent, or Firm* — Weaver Austin Villeneuve & Sampson LLP

(57) ABSTRACT

Selective deposition of a sacrificial material on a semiconductor substrate, the substrate having a surface with a plurality of regions of substrate materials having different selectivities for the sacrificial material, may be conducted such that substantial deposition of the sacrificial material occurs on a first region of the substrate surface, and no substantial deposition occurs on a second region of the substrate surface. Deposition of a non-sacrificial material may then be conducted on the substrate, such that substantial deposition of the non-sacrificial material occurs on the second region and no substantial deposition of the non-sacrificial material occurs on the first region. The sacrificial material may then be removed such that net deposition of the non-sacrificial material occurs substantially only on the second region.

18 Claims, 10 Drawing Sheets

Related U.S. Application Data

(60) Provisional application No. 62/617,616, filed on Jan. 16, 2018.

(51) Int. Cl.
  *C23C 16/06* (2006.01)
  *C23C 16/455* (2006.01)
  *C23C 16/505* (2006.01)
  *C23C 16/52* (2006.01)
  *H01L 21/02* (2006.01)

(52) U.S. Cl.
  CPC .. *C23C 16/45534* (2013.01); *C23C 16/45536* (2013.01); *C23C 16/45544* (2013.01); *C23C 16/505* (2013.01); *C23C 16/52* (2013.01); *H01L 21/0212* (2013.01); *H01L 21/02175* (2013.01); *H01L 21/02189* (2013.01); *H01L 21/02274* (2013.01); *H01L 21/0228* (2013.01)

(56) References Cited

U.S. PATENT DOCUMENTS

| | | | |
|---|---|---|---|
| 11,823,909 | B2 | 11/2023 | Sharma et al. |
| 2003/0190426 | A1 | 10/2003 | Padhi et al. |
| 2004/0253814 | A1 | 12/2004 | Cheng et al. |
| 2008/0079172 | A1 | 4/2008 | Hsu et al. |
| 2008/0242097 | A1 | 10/2008 | Boescke et al. |
| 2010/0055422 | A1* | 3/2010 | Kong .............. H01L 21/7687 428/209 |
| 2012/0325109 | A1 | 12/2012 | Kong et al. |
| 2015/0332912 | A1 | 11/2015 | Nowak et al. |
| 2017/0342553 | A1 | 11/2017 | Yu et al. |
| 2019/0157079 | A1* | 5/2019 | Ke .............. H01L 21/02323 |
| 2021/0098257 | A1 | 4/2021 | Sharma et al. |

FOREIGN PATENT DOCUMENTS

| | | |
|---|---|---|
| KR | 20150133644 A | 11/2015 |
| KR | 20170135760 A | 12/2017 |
| WO | WO-2017087138 A1 | 5/2017 |

OTHER PUBLICATIONS

International Search Report and Written Opinion of the international searching authority, dated May 8, 2019 in PCT Application PCT/US2019/013640.

KR Office Action dated Aug. 22, 2023, in Application No. KR10-2020-7023323 with English translation.

U.S. Notice of Allowance dated Jul. 12, 2023 in U.S. Appl. No. 15/733,366.

U.S. Notice of Allowance dated Sep. 14, 2023 in U.S. Appl. No. 15/733,366.

CN Office Action dated Jun. 4, 2024 in CN Application No. 201980018132.8 with English translation.

* cited by examiner

SELECTIVE PROCESSING WITH ETCH RESIDUE-BASED INHIBITORS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Selective deposition using conventional vapor deposition processing (ALD, CVD, PEALD, PECVD) has been demonstrated for several film/substrate systems, but in all cases, selectivity is lost over time. An approach to deal with the loss of selectivity is to incorporate periodic etch back or reset steps which restore both surfaces (the surface where deposition is desired and the surface where it is not desired) to a state where selectivity is regained.

SUMMARY

Provided are methods and apparatus for conducting a deposition on a semiconductor substrate. The methods involve selectively depositing a sacrificial material on a semiconductor substrate, the substrate having a surface with a plurality of regions of substrate materials having different selectivities for the sacrificial material, such that substantial deposition of the sacrificial material occurs on a first region of the substrate surface, and no substantial deposition occurs on a second region of the substrate surface. Deposition of a non-sacrificial material may then be conducted on the substrate, such that substantial deposition of the non-sacrificial material occurs on the second region and no substantial deposition of the non-sacrificial material occurs on the first region. The sacrificial material may then be removed such that net deposition of the non-sacrificial material occurs substantially only on the second region.

In various embodiments, the selective deposition of the sacrificial material may occur during a periodic etch back/reset operation during which etch residues produced provide some or all of the sacrificial material for the selective deposition.

In various embodiments, the selectivity of the deposition of the non-sacrificial material may be based on a difference in electrical properties of the first and second regions substrate materials.

In various embodiments, the deposition of the sacrificial material may occur on a first region of the substrate surface by non-covalent bonding, and the deposition of the non-sacrificial material may occur on the second region of the substrate surface by covalent bonding.

In various embodiments, the substantial deposition of the non-sacrificial material occurs on the second region and no substantial deposition of the non-sacrificial material on the sacrificial material on the first region of the substrate may have a chemical basis.

In various embodiments, the first and second regions may be dielectric and metal, respectively, or different dielectrics, respectively, the different dielectrics may have different dielectric constants, the dielectric constant of the first region may be lower, for example, by at least a factor of 4, than the dielectric constant of the second region. In various embodiments, the dielectric of the first region is $SiO_2$ or SiN, and the dielectric of the second regions is $ZrO_2$.

In various embodiments, the sacrificial material may be a fluorocarbon (CFx) or boron oxide (BOxCly).

In various embodiments, the non-sacrificial material may be a metal, for example Cu, Al, W, Co or Ti. In various embodiments, the deposition of the non-sacrificial material may be a blanket deposition.

In various embodiments, the selective deposition of the sacrificial material occurs during a periodic etch back/reset operation during which etch residues produced provide some or all of the sacrificial material for the selective deposition.

In various embodiments, an apparatus for processing substrates is provided, including one or more process chambers, each process chamber having a chuck; one or more gas inlets into the process chambers and associated flow-control hardware; and a controller having a processor and a memory, wherein the processor and the memory are communicatively connected with one another, the at least one processor is at least operatively connected with the flow-control hardware, and the memory stores computer-executable instructions for controlling the at least one processor to at least control the flow-control hardware by: conducting a deposition on a semiconductor substrate including selectively depositing a sacrificial material on a semiconductor substrate, the substrate having a surface with a plurality of regions of substrate materials having different selectivities for the sacrificial material, such that substantial deposition of the sacrificial material occurs on a first region of the substrate surface, and no substantial deposition occurs on a second region of the substrate surface; depositing a non-sacrificial material on the substrate, such that substantial deposition of the non-sacrificial material occurs on the second region and no substantial deposition of the non-sacrificial material occurs on the first region; and, removing the sacrificial material such that net deposition of the non-sacrificial material occurs substantially only on the second region.

These and other aspects of the present disclosure are described in further detail below, at least in part with reference to the drawings.

DETAILED DESCRIPTION

Figure 1:
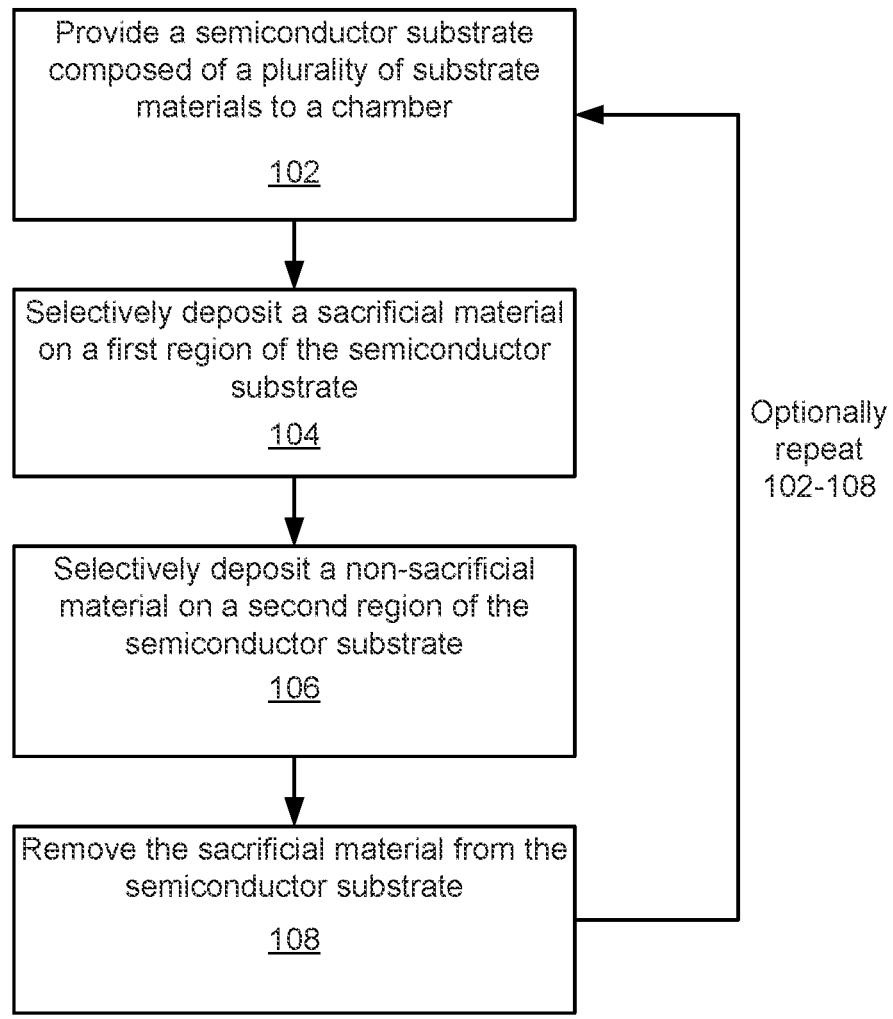
FIG. 1 is a process flow diagram depicting operations for a method in accordance with the disclosed embodiments.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

Methods provided herein relate to the combination of selective deposition processes, such as by ALD, with controlled etching, such as ALE, to retain growth selectivity and improve upon defect elimination performance during the selective deposition process. In some embodiments, selective deposition on a semiconductor substrate may be accomplished by periodically alternating between ALD and ALE processes.

Selective deposition enables the continued device miniaturization and fabrication of various three-dimensional (3D) architectures by building, for example, a wafer upward from the bottom thereof. Additional advantages for selective deposition include, but are not otherwise limited to: simplified integration flows (i.e., without requiring separate lithography and/or etch processes), enhanced feature density and/or scaling (i.e., such that additional device features may be included in a smaller cross-sectional area) and patterning (i.e., improved overlay).

However, currently available methods for selective deposition are often material and/or system specific, thus no generalized approach to deposit metal and/or dielectric materials selectively at will exists. Other challenges otherwise associated with selective deposition are the creation of defects and the need for of a relatively narrow process window. Deposition selectivity may also deteriorate as deposition proceeds, since typical deposition processes are limited in their ability to assess nucleation delay and/or inability to grow materials selectively. Further, such deterioration of deposition selectivity makes relatively thicker film growth via selective deposition relatively difficult.

An approach to deal with the loss of selectivity is to incorporate periodic etch back or reset steps which restore both surfaces (the surface where deposition is desired and the surface where it is not desired) to a state where selectivity is regained.

Currently, selective processing using cyclical deposition-etch steps achieves selectivity primarily using covalently attached chemical inhibitors during the deposition step. The etch step of the process is functionally just a recess step and does not play a significant role in enhancing the selectivity during the deposition step. Also, the inhibition methods are primarily through covalent bonding due to the inherent selectivity of chemical processes toward specific surface functional groups.

An alternative approach uses residues produced, or of the sort produced, during the etch step of a selective process as selectively deposited sacrificial materials. Through appropriate modification of the etch back step of this process, subsequent deposition selectivity can be enhanced due to deposition of etch residue-based type inhibitors, such as fluorocarbons (CFx) or boron oxides (BOxCly), only on the surface where film deposition is being inhibited.

These residues, sometimes referred to as "polymer," have been observed to selectivity deposit on some substrate surface materials, but not others; for example, dielectric, but not metal (e.g., SiO2, but not Cu), or one dielectric, but not another (e.g., $SiO_2$ and SiN, but not on $ZrO_2$). These selectively deposited sacrificial materials, which may be produced and deposited during a periodic etch back/reset operation in a net deposition process, may be non-covalently attached to the substrate surface, and then later removed in an ashing step, such as may be performed by a Gamma™ module, available from Lam Research Corporation.

Suitable (non-sacrificial) film deposition process conditions for some embodiments include: 0.5-10 torr, total flow 1-20 slm, temperature between 50 and 400° C., RF power (if used) between 100 and 1000 W/300 mm wafer, timing: 1-5 sec precursor exposure with 1-5 second purges in between.

Suitable inhibitor (sacrificial material) deposition may be performed using either CFx or $BO_x$ precursors including $C_xF_y$ (i.e. $CF_4$, $C_4F_8$) or $BH_3$, $BCl_3$, $O_2$ with pressure 10-500 mtorr, total flows 10-1000 sccm, temperature 0-120° C., RF power 10-1000 W, RF Bias 0-100V. Etch residue is typically $CF_x$ polymer or $BO_x$ polymer (e.g., Teflon™ is a $CF_x$ polymer) and it may be exclusively or almost exclusively derived from the feed gas; the material being etched can mix in as well.

FIG. 1 provides a process flow diagram for performing operations of a method in accordance with disclosed embodiments. Operations in FIG. 1 may be performed at, for example, a chamber pressure between about 1 mTorr and about 100 Torr, e.g., about 1 mTorr and about 1 Torr. The method shown in FIG. 1 generally relates to conducting a deposition on a semiconductor substrate. Specifically, as operation 102, a semiconductor substrate composed of, or otherwise comprising, a plurality of distinct substrate materials is provided to a processing chamber.

Referring to the chamber in which the semiconductor substrate is provided in operation 102, the chamber may be in a multi-chamber apparatus or a single-chamber apparatus. The semiconductor substrate may be a silicon wafer, e.g., a 200-mm wafer, a 300-mm wafer, or a 450-mm wafer, including wafers having one or more layers of material, such as dielectric, conducting, or semi-conducting material, deposited thereon. In some embodiments, the semiconductor substrate includes a blanket layer of silicon, such as amorphous silicon, or a blanket layer of germanium. The semiconductor substrate may also include a patterned mask layer previously deposited and patterned on the semiconductor substrate, for example a mask layer of amorphous silicon.

In some embodiments, the layers on the substrate may be patterned. Substrates may have "features" such as via or contact holes, which may be characterized by one or more of narrow and/or reentrant openings, constrictions within the feature, or high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

At operation 104, a sacrificial material is selectively deposited, for example as described with reference to FIG. 6 below, onto a first region of the semiconductor substrate. The substrate has a surface with a plurality of regions of substrate materials having different selectivities for the sacrificial material, such that substantial deposition of the sacrificial material occurs on the first region of the substrate surface, and no substantial deposition occurs on a second region of the substrate surface. For example, the sacrificial material may be an etch-residue polymer such as fluorocarbons ($CF_x$) or boron oxides (BOxCly). In some embodiments, the deposition of the sacrificial material occurs on the first region of the substrate surface by non-covalent bonding.

The sacrificial material could be deposited, for example, by CVD, ALD or a modification of ALE, where instead of or in addition to etching the semiconductor substrate the etch-residue is deposited onto the semiconductor substrate. Deposition of the sacrificial material by ALD, for example such as as described below, leads to covalent attachment. But deposition by CVD, for example using CxFy compounds, can produce thin PTFE-like films that are mainly adsorbed via non-covalent interactions with the surface. Suitable CVD conditions include pressure: 1-10 Torr, precursor gas flows: 1-20 slm, temperature 100-400° C.

ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

Operation 104, as shown in FIG. 1, may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and optional plasma, and (iv) purging of the chamber. In some embodiments, etching may be performed nonconformally.

Generally, ALD is a technique that deposits thin layers of material using sequential self-limiting reactions. ALD may be performed using any suitable technique. In various embodiments, ALD may be performed with plasma, or may be performed thermally. Also, operation 104 may be performed in cycles, i.e. referred to herein as an "ALD cycle." The concept of an ALD cycle is relevant to the discussion of various embodiments herein. An ALD cycle, typically, is the minimum set of operations used to perform a surface deposition reaction one time. For example, the result of one successful ALD cycle is the production of at least a partial silicon-containing film layer on a desired substrate surface, such as the first substrate material of operation 104. Typically, an ALD cycle includes operations to deliver and adsorb at least one reactant to the substrate surface, to then react the adsorbed reactant with one or more reactants residing on the substrate surface to form, for example, at least a partial layer of film. The ALD cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/ adsorption of a silicon-containing precursor, (ii) purging of silicon-containing precursor from the chamber, (iii) delivery of a second reactant and a plasma, and (iv) purging of plasma from the chamber.

Figure 6:
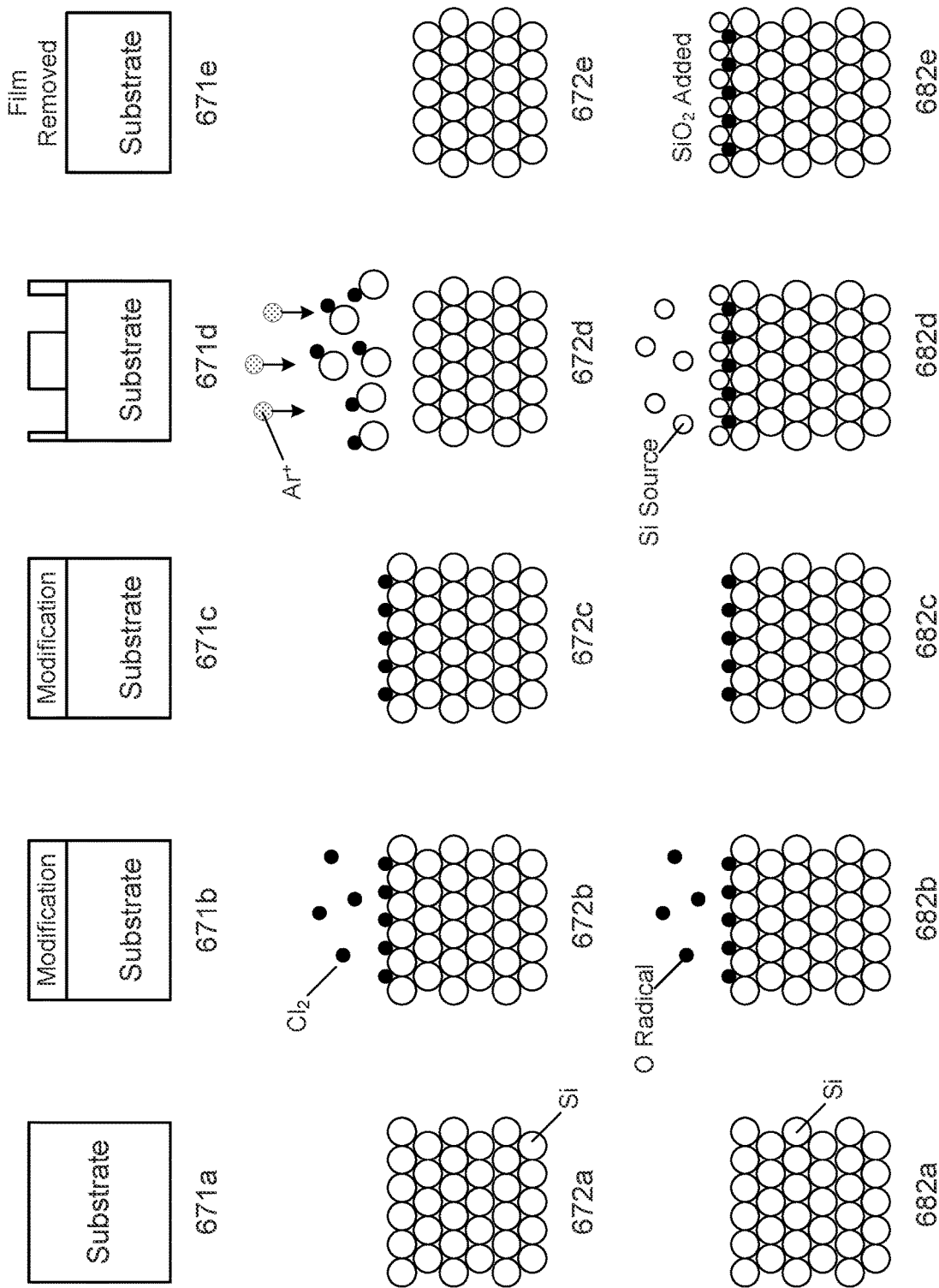
FIG. 6 is a schematic illustration of examples of atomic layer etch and deposition.

FIG. 6 shows two example schematic illustrations of an ALE cycle. Diagrams 671a-671e show a generic ALE cycle. In 671a, the substrate is provided. In 671b, the surface of the substrate is modified. In 671c, the next step is prepared. In 671b, the modified layer is being etched. In 671e, the modified layer is removed. Similarly, diagrams 672a-672e show an example of an ALE cycle for etching a silicon film. In 672a, a silicon substrate is provided, which includes many silicon atoms. In 672b, reactant gas chlorine is introduced to the substrate which modifies the surface of the substrate. The schematic in 672b shows that some chlorine is adsorbed onto the surface of the substrate as an example. Although chlorine is depicted in FIG. 1B, any chlorine-containing compound or suitable reactant may be used. In 672c, the reactant gas chlorine is purged from the chamber. In 672d, a removal gas argon is introduced with a directional plasma as indicated by the Ar+ plasma species and arrows, and ion bombardment is performed to remove the modified surface of the substrate. During this operation, a bias is applied to the substrate to attract ions toward it. In 672e, the chamber is purged and the byproducts are removed.

In some embodiments, in operation 104 tetrafluoromethane ($CF_4$) may be deposited on various substrates of interest via an ALD operation and/or cycle, such substrates including (but not limited to), the following: silicon oxide ($SiO_2$), silicon nitride ($Si_3N_4$), silicon carbide (SiC), aluminum oxide ($AlO_3$), and aluminum nitride (AlN). Also, $CF_4$ may be deposited on generic high-K dieletric layers such as hafnium (Hf), zirconium (Zr) and tin oxide ($SnO_2$) and/or conducting films such as tungsten (W), copper (Cu), cobalt (Co), aluminum (Al), titanium (Ti), silicon (Si) and carbon (C) individually and/or in any combination.

FIG. 6 shows an example schematic illustration of an ALD cycle for depositing silicon oxide ($SiO_2$). Diagrams 682a-682e show a generic ALD cycle. In 682a, a silicon substrate is provided, which includes many silicon atoms. In 682b, oxygen is introduced to the substrate as oxygen radicals, which modify the surface of the substrate. This may be the delivery of the reactant and plasma. Note some oxygen radicals are adsorbed onto the surface of the substrate as an example. In 682c, the oxygen radicals are purged from the chamber. In 682d, a silicon-containing precursor or silicon source is introduced and the silicon source reacts with the oxygen radicals adsorbed on the surface of the substrate. In 682e, the chamber is purged and the byproducts are removed, leaving behind a deposited layer of $SiO_2$.

In some embodiments, the films deposited by ALD may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage.

Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor, such as a silicon-containing precursor, in a dose provided to a process chamber housing the substrate.

Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant, such as an oxygen or nitrogen-containing gas, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

In some implementations, the ALD methods include plasma activation, such as when the second reactant is delivered to a chamber. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties. Additional examples of ALD processes are described in Puurunen, "Surface chemistry of atomic layer deposition: for the trimethylaluminum/water process", 97 J. Applied Physics 12301 (2005), which is herein incorporated by reference for the purpose of providing description for suitable ALD processes.

Further, in operation 104, in some embodiments, a carrier gas, such as $N_2$, Ar, Ne, He, and combinations thereof, may be continuously flowed. The carrier gas may be used as a purge gas. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

At operation 106, a non-sacrificial material is deposited on the substrate. Provided herein is an example of adsorption and second reactant delivery operations that may be performed in operation 106. In an adsorption operation of an ALD cycle, a substrate on which ALD is intended may be exposed to a film precursor, such as tetramethylethylzirconium or tetrakis(ethylmethylamido)zirconium ($Zr(NEtMe)_4$), to adsorb onto the substrate surface. In some embodiments, the film precursor may be a silicon-containing precursor. In some embodiments, the film precursor, such as $Zr(NEtMe)_4$, may be adsorbed onto about 60% of the substrate surface. In various embodiments, when the film precursor is flowed to the chamber, the film precursor adsorbs onto active sites on the surface of the substrate, forming a thin layer of the film precursor on the surface. In various embodiments, this layer may be less than a monolayer.

After adsorption, the chamber may be optionally purged to remove excess precursor in gas phase that did not adsorb onto the surface of the substrate. Purging may involve a sweep gas, which may be a carrier gas used in other operations or a different gas. In some embodiments, purging may involve evacuating the chamber.

In a second reactant delivery operation of an ALD cycle, the substrate may be exposed to a second reactant and, optionally, a plasma. In various embodiments, the second reactant is oxygen ($O_2$) or nitrogen ($N_2$) or combinations thereof. In some embodiments where a silicon oxide layer is deposited, oxygen is used as the second reactant. In some embodiments, second reactant flow and the plasma are both turned on. In some embodiments, second reactant flow may be turned on prior to turning on the plasma to, for example, allow the second reactant flow to stabilize.

In some embodiments, the optional plasma is an in-situ plasma, such that the plasma is formed directly above the substrate surface in the chamber. In various embodiments, the plasma may be an inductively coupled plasma or a capacitively coupled plasma. An inductively coupled plasma may be set at a plasma between about SOW and about 2000 W. In some embodiments, a bias may be applied between about OV and about 500V. During delivery of the second reactant, the film precursor, such as $Zr(NEtMe)_4$, is turned off The substrate may be exposed to the second reactant and the optional plasma for a duration that exceeds a time for plasma to interact with all precursors adsorbed on the substrate surface, forming a continuous film atop the substrate surface.

After the second reactant delivery operation, the chamber may be purged, such as by introducing a carrier or inert gas. Conditions for this operation may be any of those described above for purge processes.

In various embodiments, ALD cycles may be repeated. For example, operations for ALD may be performed for about 5 to about 70 cycles, even up to 300 cycles prior to substantial growth of the deposited film and/or layer of material. Thus, any suitable number of deposition cycles may be included and/or performed to deposit a desired film thickness of the deposited film. In some embodiments, an ALD cycle may deposit about 1 A per cycle. Depending on the exposure time of the operations, each cycle may deposit a film, such as a zirconium oxide or film, having a thickness between about 5 Å and about 70 Å. In some embodiments, about two to about three cycles of ALD may be performed per minute. In some embodiments, more than about three cycles may be performed per minute, such as in chambers with inlets positioned to be closer to the substrate.

In some embodiments, ALD operations produce conformal films capable of protecting the features from lateral etching in subsequent ALE processes, which may occur in the same chamber. In some embodiments, ALD is integrated to selectively deposit films on a substrate, such as to deposit films on corners of a feature to protect them from erosion during etching processes. In some embodiments, at least one of operation 104 and 106 is self-limiting reaction. In some embodiments, at least one of operation 104 and 106 is as self-limiting reaction as possible. For example, in some embodiments, only operation 106 is a self-limiting process. In some embodiments, only operation 104 is a self-limiting process. In some embodiments, both operations 104 and 106 are self-limiting. In various embodiments, operations 104 and 106 may be performed sequentially. Examples of sequentially performing these operations are further described below with respect to FIG. 2.

At operation 108 the sacrificial material is then removed. The removal can be accomplished by various means, including ashing or a separate etch that is selective to the sacrificial material. The net effect is that deposition of the non-sacrificial material occurs substantially only on the second region, with substantially no deposition on the first region.

Figure 2:
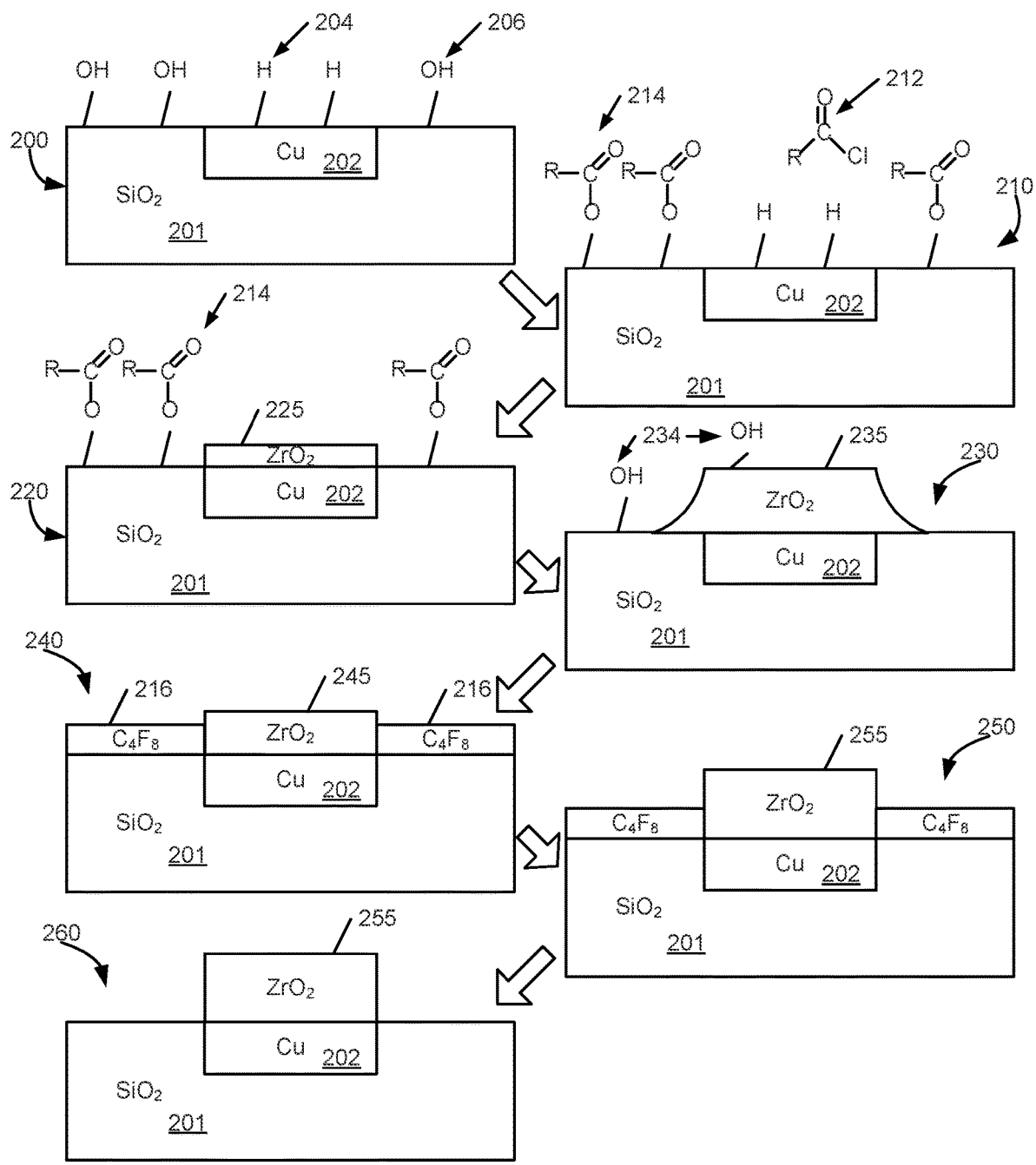
FIG. 2 is a process flow diagram depicting an example process for performing disclosed embodiments.

FIG. 2 is a process flow diagram for an example embodiment of the methods disclosed herein. This process could take place within a process chamber as disclosed herein. In operation 200 there is a substrate in a process chamber with a first region 201 that is silicon oxide, and a second region 202 that is copper. Due to the chemical properties of silicon oxide, it will have exposed hydroxyl groups 206. Copper will instead have exposed hydrogen atoms 204. The surface chemistry of first region 201 has many hydroxyl groups available to react, while the second region 202 does not. This difference in surface chemistry between silicon oxide and copper allows for chemical selectivity in depositing a masking layer.

At step 210 masking molecules 212 are introduced to the chamber. In some embodiments masking molecules 212 can be acyl chlorides (RCOCl). The acyl chloride reacts with the hydroxyl groups 206 of the first region 201, forming a mono-layer 214. The acyl chloride could have a variety of non-reactive chemistry for the R group. The acyl chlorides do not interact with hydrogen atoms of the second region 202, leaving it exposed for further processing. Any masking molecule could be used that selectively reacts with hydroxyl groups and not hydrogen atoms, including silicon chlorides ($R_y SiCl_x$) or silicon amides ($R_y Si(NR'2)_x$)

At step 220 a zirconium oxide layer 225 is deposited over the second region 202. The zirconium oxide layer could be deposited by a variety of techniques, including CVD or ALD. Suitable ALD conditions are as follows: alternating exposures of Zr precursor and water, with $N_2$ purging in between; timing of each step, 1-5 sec; flows of precursors 10-100 sccm; flow of purge gas 1-10 slm; pressure 1-3 Torr; temp=100° C.-300° C. The mono-layer 214 acts to inhibit the deposition of zirconium oxide on the first region 201.

At step 230, a zirconium oxide layer 235 is shown being deposited on the first region 201 and the second region 202. In this depiction, the mono-layer 214 has been removed by the deposition process, and thus the first region 201 is exposed to the deposition process. In other embodiments, the mono-layer 214 may not be removed, but may be degraded such that deposition selectivity is diminished. If the deposition process uses a plasma, and the mono-layer is organic, it is likely removed. If the deposition process is thermal, then it would not likely be removed. Alternatively, the mono-layer could be removed in a corrective step such as ALE which also may use a plasma. Suitable ALE conditions are as follows: pressure 10-500 mTorr, total flows 10-1000 sccm, temperature 0-120° C.; RF power 10-1000 W; RF Bias 0-100V.

Returning to FIG. 2, the second region 202 is covered by zirconium oxide 235. Due to the oxygen molecules in the zirconium oxide, both the first region 201 and the second region 202 have hydroxyl groups 234. Thus, both regions exhibit the same selectivity for reduction reactions. Because the acyl chloride reacts with hydroxyl groups, it can no longer be used to form a mono-layer only on the first region 201, as it would also react and form a mono-layer on the second region 202.

A solution to the lack of chemical selectivity is to deposit a masking layer that is selective to silicon oxide and not zirconium oxide. At step 240, the zirconium oxide is etched back into shape 245 to cover only the second region 202. Octafluorocyclobutane ($C_4F_8$), for example, may be used to etch the zirconium oxide into shape 245. In addition, a layer of $C_4F_8$ is deposited on the first region 201. $C_4F_8$ is selective to silicon oxide over zirconium oxide, and thus a layer of polymer 216 composed of $C_4F_8$ is deposited on the first region 201 without depositing a layer on the second region 202.

At step 250 deposition of zirconium oxide continues until the specified thickness of the layer is achieved. In various embodiments, steps 230-250 may be repeated in order to etch back the zirconium oxide layer and deposit additional polymer 216.

At step 260 the polymer 216 is removed. Removal can be accomplished by various techniques including ashing. Suitable ash conditions are as follows: temp 0-200° C.; total flows 1-10 slm; pressure 1-3 Torr; power 500-2000 W per 300 mm wafer area. The net effect is that material is not deposited on the first region 201, while the desired deposition of zirconium oxide 255 is achieved on the second region 202.

Figure 3:
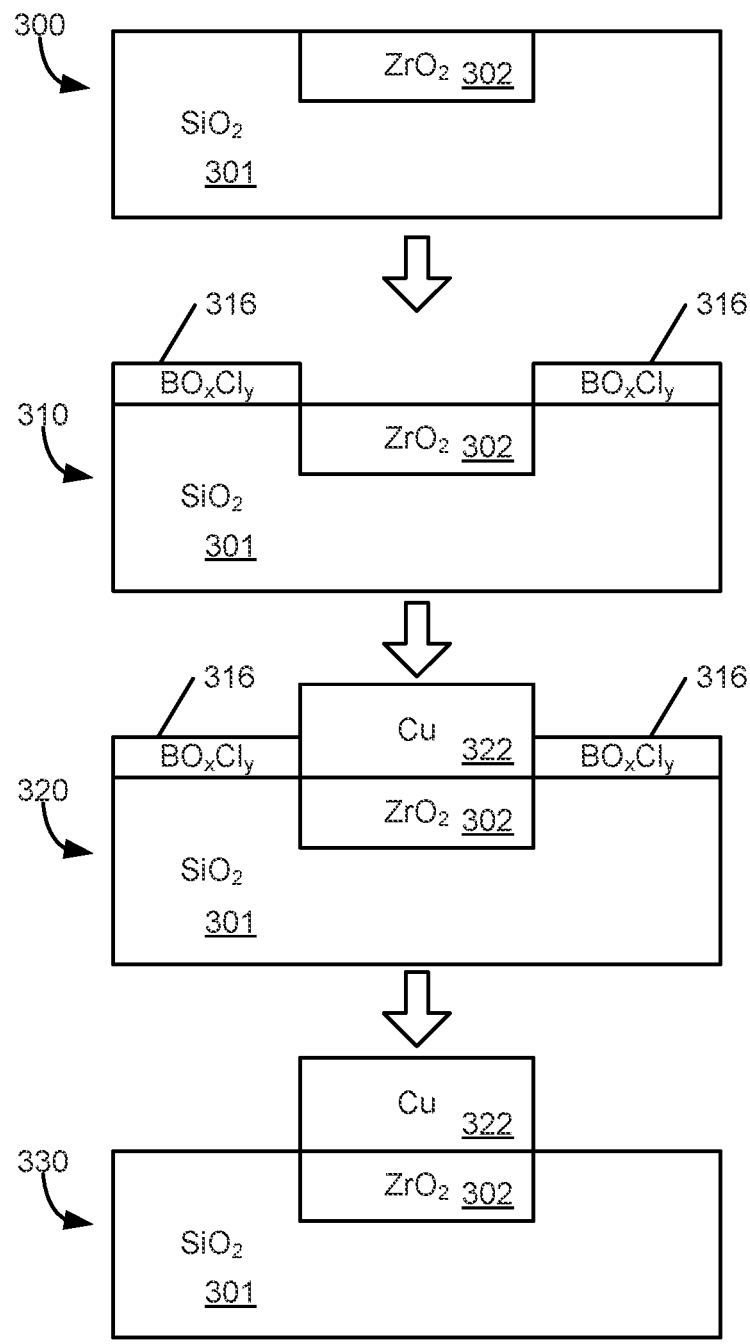
FIG. 3 is a process flow diagram depicting an example process for performing disclosed embodiments.

FIG. 3 is another example embodiment of the disclosed methods herein for depositing copper on zirconium oxide. In step 300 a chamber receives a substrate with a first region 301 that is made of silicon oxide, and a second region 302 that is zirconium oxide. Similar to FIG. 2 above, silicon oxide and zirconium oxide are both dielectrics with similar chemical selectivities for acyl chloride reactions due to their oxygen atoms. However, due to their respective dielectric constants (about 4 for silicon oxide and about 20 for zirconium oxide), polymers as disclosed herein will selectively form non-covalent bonds with only silicon oxide.

Thus, in operation 310 borane ($BH_3$), boron trichloride ($BCl_3$), and oxygen ($O_2$) are introduced to the chamber and form $BO_xCl_y$ polymer. $BO_xCl_y$ selectively deposits on the first region 301 by forming non-covalent bonds with silicon oxide, but does not deposit on the second region 302, leaving it exposed. The $BO_xCl_y$ forms a polymer 316 that inhibits deposition on the first region 301.

In operation 320 copper is deposited onto the substrate to form layer 322. Copper can be deposited by a variety of techniques, including sputtering, ALD, CVD, electroplating, electroless deposition and PVD. The polymer 316 inhibits the deposition of copper on the first region 301, and thus the copper layer 322 substantially accumulates only on the second region 302, on the zirconium oxide.

Finally, in operation 330 the polymer 316 is removed by various techniques, including ashing. Suitable deposition, etch and ash conditions are described above. The net effect of operations 300-330 is to deposit copper substantially only on the zirconium oxide.

Figure 4:
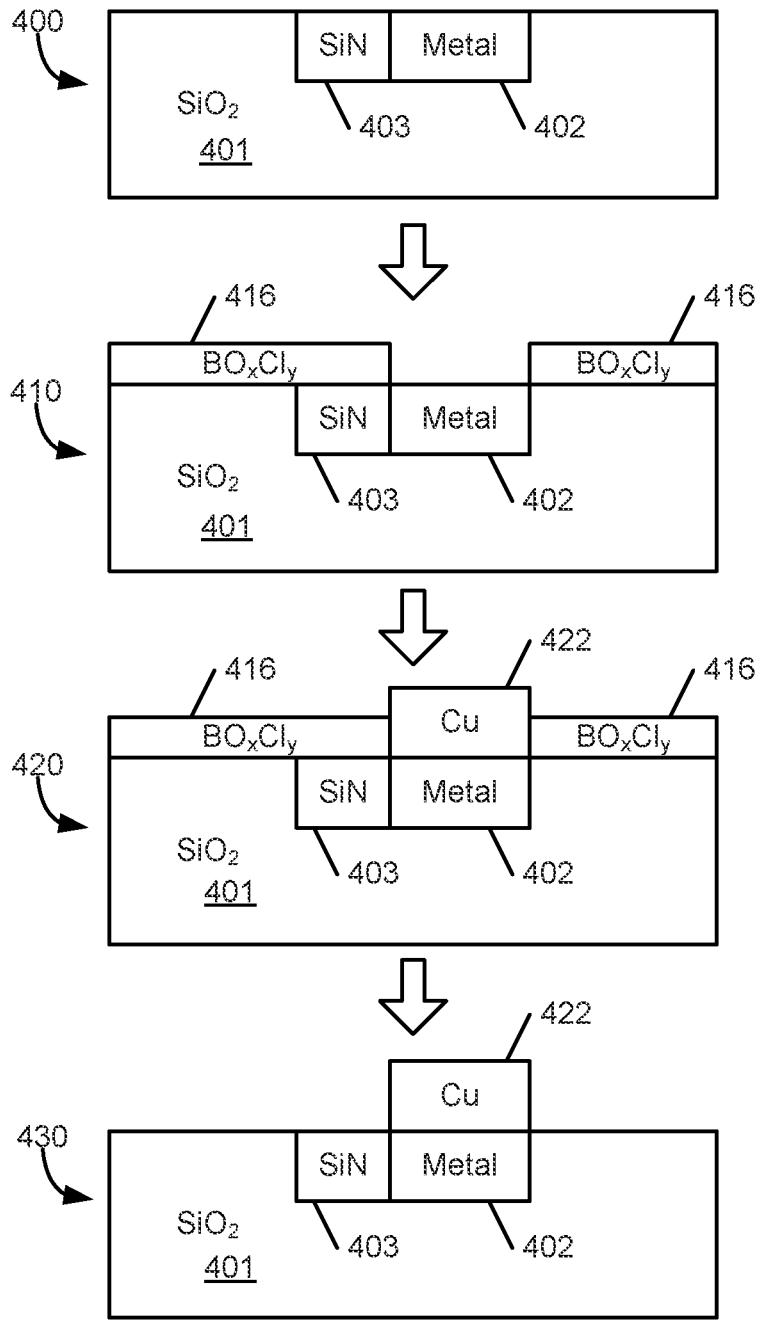
FIG. 4 is a process flow diagram depicting an example process for performing disclosed embodiments.

FIG. 4 demonstrates an embodiment of the methods disclosed herein for depositing copper on a metal in the presence of silicon oxide and silicon nitride. In step 400 a chamber receives a substrate with a first region 401 that is made of silicon oxide and a silicon nitride 403, and a second region 402 that is a metal. Metals that could be used with the methods disclosed herein include copper, aluminum, tungsten, cobalt, or titanium. Similar to FIG. 2 above, silicon oxide and silicon nitride can exhibit chemical selectivity that allows for selective deposition using acyl chlorides on the first region 401 without deposition on the second region 402. However, in some embodiments only polymer is used to selectively deposit a sacrificial material.

Thus, in operation 410 borane ($BH_3$), boron trichloride ($BCl_3$), and oxygen ($O_2$) are introduced to the chamber and form $BO_xCl_y$. $BO_xCl_y$ selectively deposits on the first region 401 by forming non covalent bonds with silicon oxide and silicon nitride, but does not deposit on the second region 402, leaving it exposed. The $BO_xCl_y$ forms a polymer 416 that inhibits deposition on the first region 401.

In operation 420 copper is deposited onto the substrate to form layer 422. Copper can be deposited by a variety of techniques, including sputtering, ALD, CVD, electroplating, electroless deposition and PVD. The polymer 416 inhibits the deposition of copper on the first region 401, and thus the copper layer 422 substantially accumulates only on the metal layer in the second region 402.

Finally, in operation 430 the polymer 416 is removed by various techniques, including ashing. Suitable deposition, etch and ash conditions are described above. The net effect of operations 400-430 is to deposit copper substantially only on the metal layer.

Figure 5:
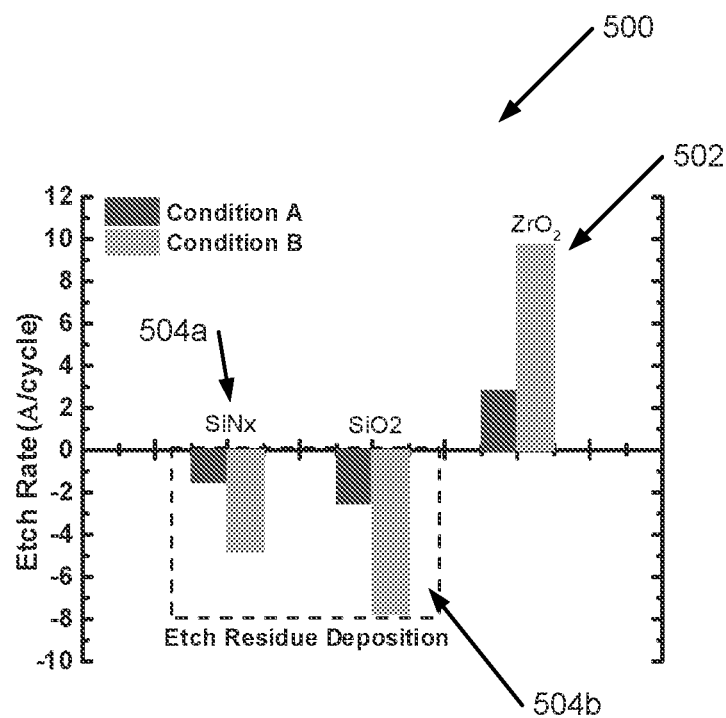
FIG. 5 is a schematic illustration of an embodiment of an atomic layer deposition process station.

FIG. 5 is a chart that demonstrates etch and deposition effects of etch-residue compounds as disclosed herein. Zirconium oxide is etched in accordance with the etch conditions described above using gas composition $BCl_3/Ar$ (Condition A) and $Cl_2/O_2$ (Condition B). Silicon nitride and silicon oxide, however, have a negative etch rate under the same conditions, i.e., a deposition effect. Thus, by using the disclosed etch chemistries, a sacrificial inhibiting layer can be selectively deposited on silicon nitride and silicon oxide, while leaving zirconium oxide uncovered for additional etching or selective deposition.

Another aspect involves an apparatus for processing substrates, the apparatus including: one or more process chambers, each process chamber having a chuck; one or more gas inlets into the process chambers and associated flow-control hardware; and a controller having a processor and a memory, wherein the processor and the memory are communicatively connected with one another, the at least one processor is at least operatively connected with the flow-control hardware, and the memory stores computer-executable instructions for controlling the at least one processor to at least control the flow-control hardware by: conducting a deposition on a semiconductor substrate including selectively depositing a sacrificial material on a semiconductor substrate, the substrate having a surface with a plurality of regions of substrate materials having different selectivities for the sacrificial material, such that substantial deposition of the sacrificial material occurs on a first region of the substrate surface, and no substantial deposition occurs on a second region of the substrate surface; depositing a non-sacrificial material on the substrate, such that substantial deposition of the non-sacrificial material occurs on the second region and no substantial deposition of the non-sacrificial material occurs on the first region; and, removing the sacrificial material such that net deposition of the non-sacrificial material occurs substantially only on the second region.

Apparatus

Figure 7:
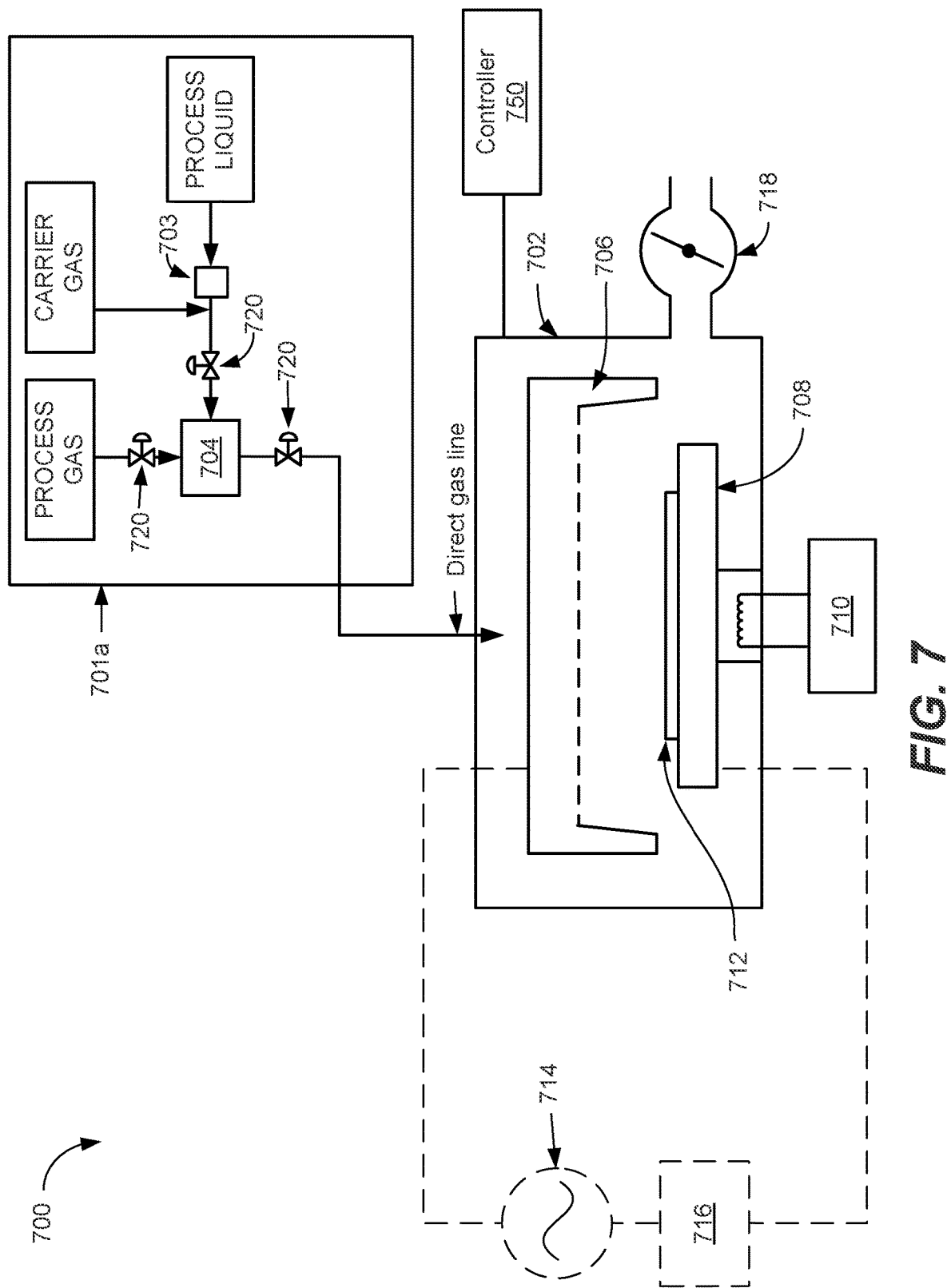
FIG. 7 is a schematic diagram of an example process chamber for performing disclosed embodiments.
Figure 8:
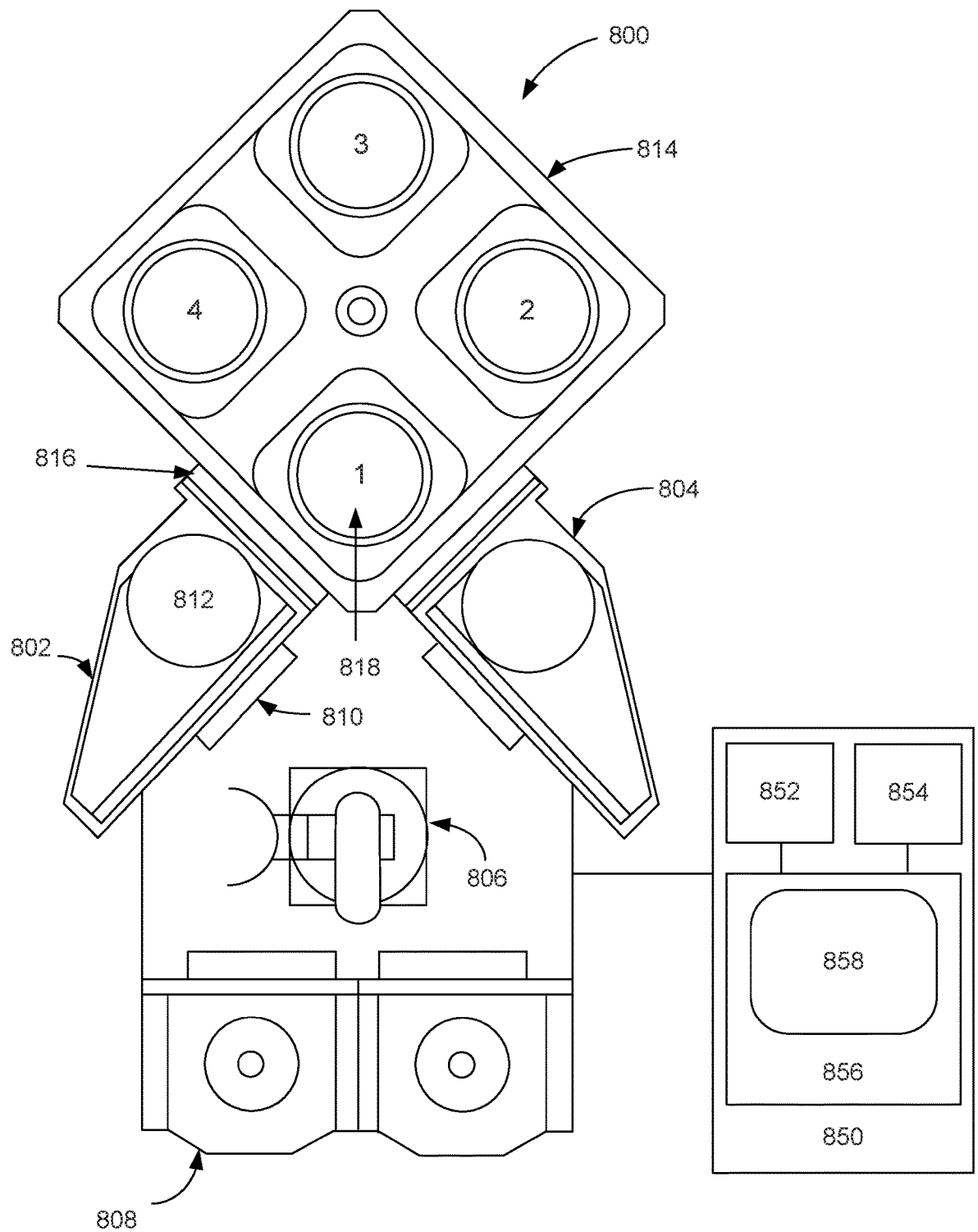
FIG. 8 is schematic diagram of an example process apparatus for performing disclosed embodiments.

FIG. 7 depicts a schematic illustration of an embodiment of an atomic layer deposition (ALD) process station 700 having a process chamber body 702 for maintaining a low pressure environment, suitable for conducting selective deposition, including periodic etch/residue formation and selective deposition, as described herein. A plurality of ALD process stations 700 may be included in a common low pressure process tool environment. For example, FIG. 8 depicts an embodiment of a multi-station processing tool 800. In some embodiments, one or more hardware parameters of ALD process station 700 including those discussed in detail below may be adjusted programmatically by one or more computer controllers 750.

ALD process station 700 fluidly communicates with reactant delivery system 701a for delivering process gases to a distribution showerhead 706. Reactant delivery system 701a includes a mixing vessel 704 for blending and/or conditioning process gases, such as an aminosilane precursor gas, or oxidizing agent gas (e.g., ozone), or ammonia and/or nitrogen gas, for delivery to showerhead 706. One or more mixing vessel inlet valves 420 may control introduction of process gases to mixing vessel 704. Nitrogen plasma and/or ammonia plasma may also be delivered to the showerhead 706 or may be generated in the ALD process station 700.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non limiting example, piping downstream of vaporization point 703 has an increasing temperature profile extending from approximately 100° C. to approximately 150° C. at a mixing vessel 704.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant.

Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some embodiments, pedestal 708 may be raised or lowered to expose substrate 712 to a volume between the substrate 712 and the showerhead 706. It will be appreciated that, in some embodiments, pedestal height may be adjusted programmatically by a suitable computer controller 750.

In another scenario, adjusting a height of pedestal 708 may allow a plasma density to be varied during plasma activation cycles in the process in embodiments where a plasma is ignited. At the conclusion of the process phase, pedestal 708 may be lowered during another substrate transfer phase to allow removal of substrate 712 from pedestal 708.

In some embodiments, pedestal 708 may be temperature controlled via heater 710. In some embodiments, the pedestal 708 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 700 may be provided by butterfly valve 718. As shown in the embodiment of FIG. 7, butterfly valve 718 throttles a vacuum provided by a downstream vacuum pump (not shown in the Figures). However, in some embodiments, pressure control of process station 700 may also be adjusted by varying a flow rate of one or more gases introduced to the process station 700.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are about 150 W to about 6000 W. Plasma may be used during treatment of a silicon nitride surface prior to selective deposition of silicon oxide on silicon oxide relative to silicon nitride. RF power supply 414 may provide RF power of any suitable frequency. In some embodiments, RF power supply 414 may be configured to control high- and low-frequency RF power sources independently of one another. Example low frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than about 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or an ammonia and/or nitrogen reactant gas, instructions for setting a flow rate of a carrier gas (such as argon), instructions for igniting a plasma, and time delay instructions for the first recipe phase. A second recipe phase may include instructions for setting a flow rate of an inert precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of an oxidizing agent gas such as ozone, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 750 may include any of the features described below with respect to system controller 850 of FIG. 8.

As described above, one or more process stations may be included in a multi-station processing tool 800 as shown in FIG. 8. The multi-station processing tool may, in some embodiments, be from the VECTOR® family of tools and/or products available from Lam Research of Fremont, CA, and conduct or otherwise assist with, the selective deposition processes described herein. FIG. 8 shows a schematic view of an embodiment of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment to treat the silicon nitride surface in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

In some embodiments, that shown in FIG. 8 may interact and/or otherwise engage with a wafer handling system for transferring wafers within processing chamber 814. In some embodiments, the wafer handling system may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., aminosilane gases, and oxidizing agent gases, ammonia, nitrogen, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Figure 9:
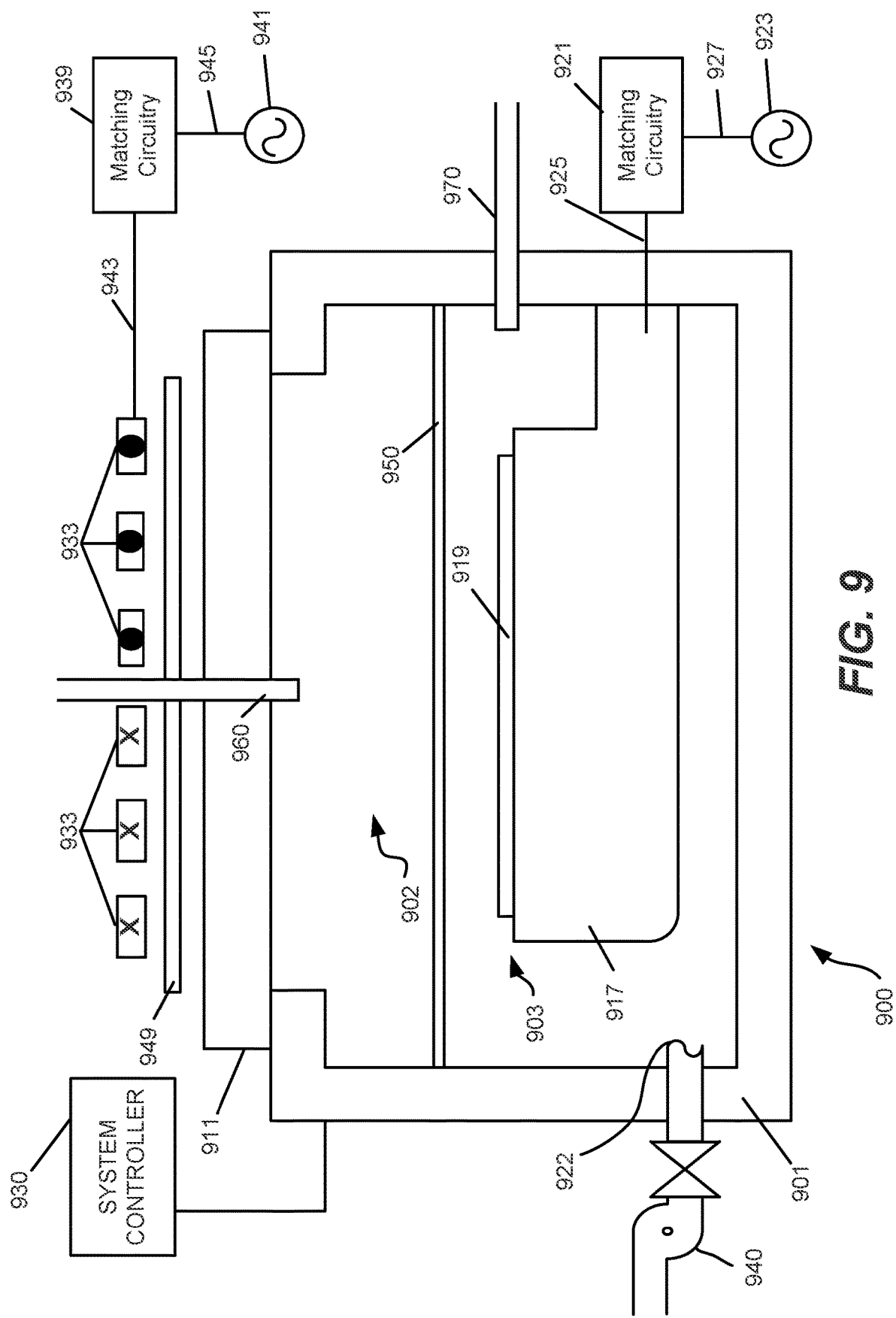
FIG. 9 is a schematic diagram of another example process apparatus for performing disclosed embodiments.

Referring generally to FIG. 9, inductively coupled plasma (ICP) reactors which, in certain embodiments, may be suitable for atomic layer etching (ALE) operations and/or atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma (CCP) reactors may also be used.

FIG. 9 schematically shows a cross-sectional view of an inductively coupled plasma integrated etching and deposition apparatus 900 appropriate for implementing certain embodiments herein, an example of which is a Kiyo™ reactor, produced by Lam Research Corp. of Fremont, CA. In some embodiments, ALE as presented and described with reference to the net selective deposition process described herein, may be primarily conducted on the Kiyo™ reactor. The inductively coupled plasma apparatus 900 includes an overall process chamber structurally defined by chamber walls 901 and a window 911 extending lengthwise therebetween. The chamber walls 901 may be fabricated from stainless steel or aluminum. The window 911 may be fabricated from quartz or other dielectric material. An optional internal plasma grid 950 divides the overall processing chamber into an upper sub-chamber 902 and a lower sub-chamber 903 positioned beneath thereof. Further, in some embodiments, the plasma grid 950 may be removed, thereby creating and/or utilizing a chamber space made of both sub-chambers 902 and 903. A chuck 917 is positioned within the lower sub-chamber 903 near the bottom inner surface. The chuck 817 is configured to receive and hold a semiconductor wafer 919 upon which the etching and deposition processes are performed. The chuck 917 can be an electrostatic chuck for supporting the wafer 919 when present. In some embodiments, an edge ring (not shown) surrounds the chuck 917, and has an upper surface that is approximately planar with a top surface of a wafer 919, when present over the chuck 917. In some embodiments, the chuck 917 also includes electrostatic electrodes for chucking and dechucking the wafer. A filter and DC clamp power supply (not shown in the Figures) may be provided for this purpose. Other control systems for lifting the wafer 919 off the chuck 917 can also be provided. The chuck 917 can be electrically charged using an RF power supply 923. The RF power supply 923 is connected to matching circuitry 821 through a connection 927. The matching circuitry 921 is connected to the chuck 917 through a connection 925. In this manner, the RF power supply 923 is connected to the chuck 917.

Elements for plasma generation include a coil 933 is positioned above window 911. In some embodiments, a coil is not used in disclosed embodiments. The coil 933 is fabricated from an electrically conductive material and includes at least one complete turn. The example of a coil 933 shown in FIG. 8 includes three turns. The cross-sections of coil 933 are shown with symbols, and coils having an "X" extend rotationally into the page, while coils having a "●" extend rotationally out of the page. Elements for plasma generation also include an RF power supply 941 configured to supply RF power to the coil 933. In general, the RF power supply 941 is connected to matching circuitry 839 through a connection 845. The matching circuitry 839 is connected to the coil 933 through a connection 943. In this manner, the RF power supply 941 is connected to the coil 933. An optional Faraday shield 949 is positioned between the coil 933 and the window 911. The Faraday shield 949 is maintained in a spaced apart relationship relative to the coil 933. The Faraday shield 949 is disposed immediately above the window 811. The coil 933, the Faraday shield 949, and the window 911 are each configured to be substantially parallel to one another in, for example, the configuration shown in FIG. 8. The Faraday shield may prevent metal or other species from depositing on the dielectric window of the plasma chamber.

Process gases (e.g., chlorine, argon, silicon tetrachloride, oxygen, nitrogen, etc.) may be flowed into the processing chamber through one or more main gas flow inlets 960 positioned in the upper chamber and/or through one or more side gas flow inlets 970. Likewise, though not explicitly shown, similar gas flow inlets may be used to supply process gases to a capacitively coupled (CCP) plasma processing chamber. A vacuum pump, e.g., a one or two stage mechanical dry pump and/or turbomolecular pump 940, may be used to draw process gases out of the process chamber 924 and to maintain a pressure within the process chamber 900. For example, the pump may be used to evacuate the chamber 901 during a purge operation of ALD. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown in FIG. 9) or a pendulum valve (not shown in FIG. 8), during operational plasma processing. Likewise, a vacuum pump and/or a valve controlled fluidic connection to the capacitively coupled plasma (CCP) processing chamber may also be used.

During operation of the ICP apparatus 900, one or more process gases may be supplied through the gas flow inlets 960 and/or 970. In certain embodiments, process gas may be supplied only through the main gas flow inlet 960, or only through the side gas flow inlet 970. In some cases, the gas flow inlets shown in the figure may be replaced by more complex gas flow inlets and/or one or more showerheads, for example. The Faraday shield 949 and/or optional grid 950 may include internal channels and holes that allow delivery of process gases to the chamber. Either or both of Faraday shield 949 and optional grid 950 may serve as a showerhead for delivery of process gases. In some embodiments, a liquid vaporization and delivery system may be situated upstream of the chamber 901, such that once a liquid reactant or precursor is vaporized, the vaporized reactant or precursor is introduced into the chamber via a gas flow inlet 960 and/or 970. Example liquid precursors include $SiCl_4$ and silicon amides.

Radio frequency power is supplied from the RF power supply 941 to the coil 933 to cause an RF current to flow into and/or through the coil 933. The RF current flowing through the coil 933 generates an electromagnetic field about the coil 933, which generates an inductive current within the upper sub-chamber 902. The physical and chemical interactions of various generated ions and radicals with the wafer 919 selectively etch features of and deposit layers on the wafer, such as that discussed and described for the ALE and/or ALD processes shown in FIG. 6 for example.

If the plasma grid is used such that there is both an upper sub-chamber 902 and a lower sub-chamber 903, the inductive current acts on gas present in the upper sub-chamber 902 to generate an electron-ion plasma in the upper sub-chamber 902. The optional internal plasma grid 950 limits the amount of hot electrons in the lower sub-chamber 903. In some embodiments, the apparatus is designed and operated such that the plasma present in the lower sub-chamber 903 is an "ion-ion" plasma.

Both the upper electron-ion plasma and the lower ion-ion plasma may contain positive and negative ions, through the ion-ion plasma will have a greater ratio of negative ions to positive ions. Volatile etching and/or deposition byproducts may be removed from the lower-sub-chamber 903 through port 922. The chuck 917 disclosed herein may operate at elevated temperatures ranging between about 10° C. and about 250° C. The temperature will depend on the process operation and specific recipe.

Chamber 901 may be coupled to facilities (not shown in FIG. 9) when installed in a clean room or a fabrication facility. Such facilities may include plumbing that provides processing gases, vacuum, temperature control, and/or environmental particle control. These facilities are coupled to chamber 901, when installed in the target fabrication facility. Additionally, chamber 901 may be coupled to a transfer chamber that allows robotics to transfer semiconductor wafers into and out of chamber 901 using, for example, typical automation.

In some embodiments, a system controller 930 (which may include one or more physical or logical controllers) controls some or all of the operations of a processing chamber. The system controller 930 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and various other factors, for example.

In some implementations, a system controller, or controller 930 is part of a system, which may be part of and/or otherwise integrated with the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to collectively as the "controller," which may control various components or subparts of the system or systems. The controller 830, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide ($SiO_2$), surfaces, circuits, and/or dies of a wafer.

The controller 930, in some implementations, may be a part of or coupled to a computer that is integrated with, coupled to the system, otherwise networked to the system, or a combination thereof. For example, the controller may be in a "cloud" and/or "cloud"-type computer network or all or at least part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller 930 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 930 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 10:
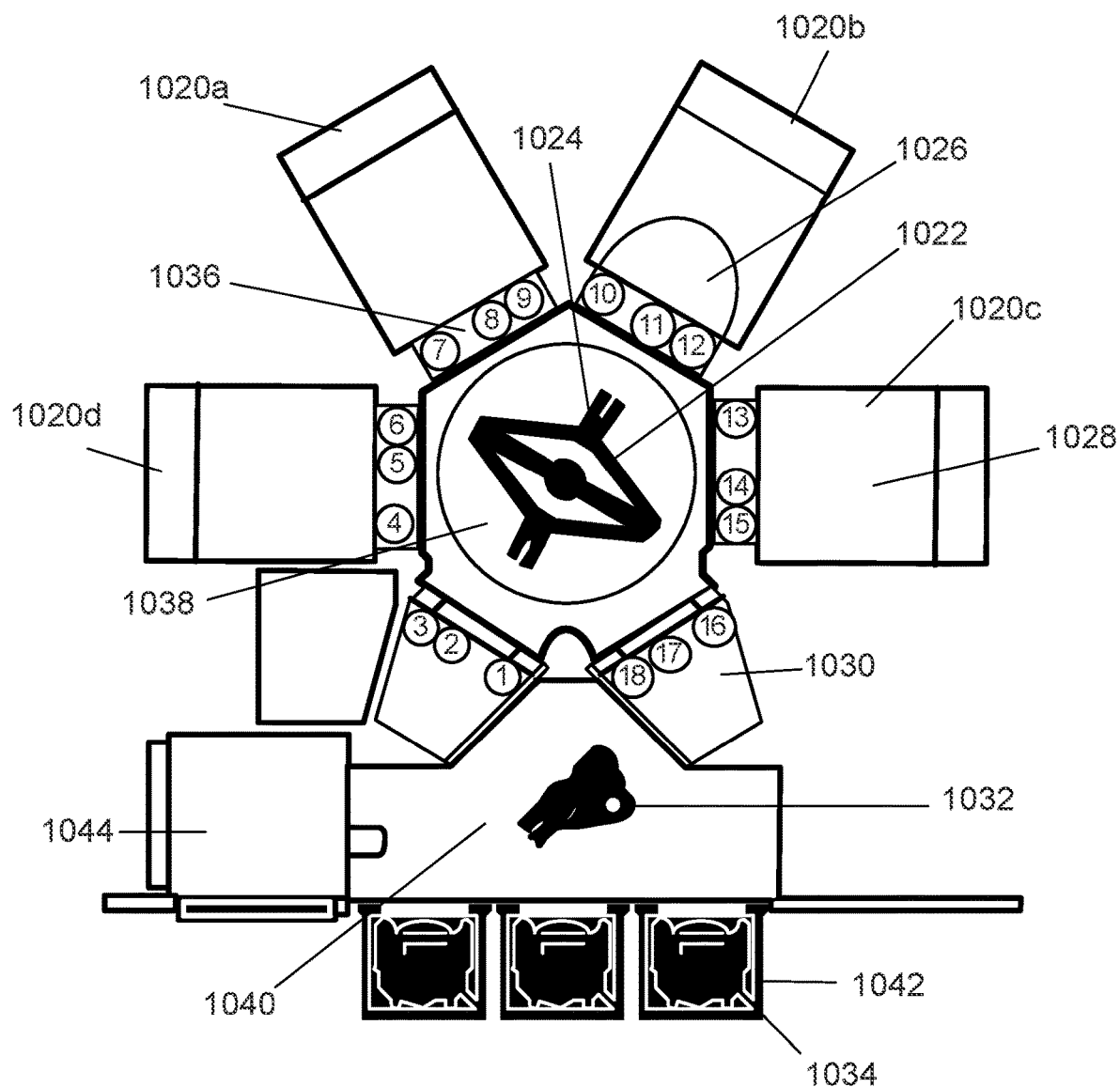
FIG. 10 is a schematic diagram of an example process cluster architecture for performing disclosed embodiments.

FIG. 10 depicts a semiconductor process cluster architecture with various modules that interface with a vacuum transfer module 1038 (VTM). The arrangement of transfer modules to "transfer" wafers among multiple storage facilities and processing modules may be referred to as a "cluster tool architecture" system. Airlock 1030, also known as a "loadlock" or transfer module, is shown in VTM 1038 with four processing modules 1020-1020d, which may be individual optimized to perform various fabrication processes. By way of example, processing modules 1020a-1020d may be implemented to perform substrate deposition, etching, ashing, ion implantation, wafer cleaning, sputtering, and/or other semiconductor-related processes. In some embodiments, ALD and ALE are performed in the same module. In some embodiments, ALD and ALE are performed in different modules of the same tool. One or more of the substrate etching processing modules (any of 1020a-1020d) may be implemented as disclosed herein, i.e., for depositing conformal films, selectively depositing films by ALD, etching patterns, and other suitable functions in accordance with the disclosed embodiments. Airlock 1030 and process module 1020 may be referred to as "stations." Each station has a facet 1036 that interfaces the station to VTM 1038. Inside each facet, sensors 1-18 are used to detect the passing of wafer 1026 when moved between respective stations.

Robot 1022 transfers wafer 1026 between stations. In one embodiment, robot 1022 has one arm, and in another embodiment, robot 1022 has two arms, where each arm has an end effector 1024 to pick wafers such as wafer 1026 for transport. Front-end robot 1032, in atmospheric transfer module (ATM) 1040, is used to transfer wafers 1026 from cassette or Front Opening Unified Pod (FOUP) 1034 in Load Port Module (LPM) 1042 to airlock 1030. Module center 1028 inside process module 1020a and/or 1020b is a suitable location for placing wafer 1026. Aligner 1044 in ATM 1040 is used to align wafers.

In an exemplary processing method, a wafer is placed in one of the FOUPs 1034 in the LPM 1042. Front-end robot 1032 transfers the wafer from the FOUP 1034 to the aligner 1044, which allows the wafer 1026 to be properly centered before it is etched or processed. After being aligned, the wafer 1026 is moved by the front-end robot 1032 into an airlock 1030. Because airlock modules have the ability to match the environment between an ATM and a VTM, the wafer 1026 is able to move between the two pressure environments without being damaged. From the airlock module 1030, the wafer 1026 is moved by robot 1022 through VTM 1038 into one of the process modules 1020a-1020d. Specifically, the robot 1022 uses end effectors 1024 located on each of its arms, for example, to grasp the wafer 1026 to move it as described, i.e. through VTM 1038 into one of the process modules 1020a-1020d. Once the wafer 1026 has been processed, it is moved by robot 1022 from the process modules 1020a-1020d to an airlock module 1030. From here, the wafer 1026 may be moved by the front-end robot 1032 to one of the FOUPs 1034 or to the aligner 1044.

It should be noted that the computer controlling the wafer movement can be local to the cluster architecture, or can be located external to the cluster architecture in the manufacturing floor, or in a remote location and connected to the cluster architecture via a network. Further, in some embodiments, a controller as described above with respect to FIGS. 8-9 may be implemented with the tool in FIG. 10.

Further, in some embodiments, that shown and described herein, namely selective deposition by ALD, including periodic etch involving residue formation and selective deposition, may be practiced and/or otherwise conducted in any one or more of the apparatuses shown and discussed in FIGS. 7-10.

Preferentially, in some embodiments, ALD is executed by a plasma-enhanced chemical vapor deposition (PECVD) product, such as those in the VECTOR® group of products available from Lam Research Corporation, of Fremont, CA. Further, additional hybrid tool developed by Lam Research may include both VECTOR® and Kiyo™ products and/or tools on a common platform, optionally together with other tools such as the Gamma™ asher product, suitable for removal of the sacrificial inhibitor material upon completion of the deposition process. Specifically, such a platform may include configurations directed toward the completion of ALD procedures on VECTOR® products, ALE procedures on Kiyo™ products, and ashing on Gamma™ products, where the VECTOR®, Kiyo™ and Gamm products are operationally integrated in a common cluster. Such a common cluster may allow for the ALD and/or ALE and/or ashing procedures described herein to be completed without a vacuum break, or without breaking vacuum, thus presenting a useful alternative to traditional process cycling in and/or between vacuum deposition and/or etch chambers.

Further, any combination of one or more (or all) of the ALD and/or ALE procedures shown and discussed in FIGS. 7-10 and/or may be completed without otherwise comprising substrate surface integrity. Further, embodiments involving the integration of VECTOR® and Kiyo™ products and/or tools may result in optimal throughout, rather than attempts to complete the discussed ALD and/or ALE procedures on, for example, Kiyo™ products alone. Moreover, in some embodiments, placement of VECTOR® and Kiyo™ products and/or tools in the same cluster where ALD is performed on VECTOR® products and ALE is performed on Kiyo™ may eliminate or substantially reduce growth defects with reference to off-target deposition.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

It is claimed:

1. A method of conducting a deposition on a semiconductor substrate, the method comprising:
    selectively depositing a sacrificial material on a semiconductor substrate, the substrate comprising a surface having a plurality of regions of substrate materials having different selectivities for the sacrificial material, such that substantial deposition of the sacrificial material occurs on a first region of the substrate surface, and no substantial deposition occurs on a second region of the substrate surface;
    depositing a non-sacrificial material on the substrate such that substantial deposition of the non-sacrificial material occurs on the second region and no substantial deposition of the non-sacrificial material occurs on sacrificial material on the first region; and
    removing the sacrificial material by ashing or selective etch such that net deposition of the non-sacrificial material occurs substantially only on the second region, and
    wherein selectively depositing is performed by chemical vapor deposition, atomic layer deposition or atomic layer etch.

2. The method of claim 1, wherein the method is performed in cycles, and wherein a cycle comprises selectively depositing a sacrificial material, depositing a non-sacrificial material, and removing the sacrificial material.

3. The method of claim 2, wherein a cycle deposits a film having a thickness between about 5 angstroms and 70 angstroms.

4. The method of claim 1, wherein the non-sacrificial material comprises aluminum oxide.

5. The method of claim 1, wherein the selectivity of the deposition of the non-sacrificial material is based on a difference in electrical properties of the first and second regions substrate materials.

6. The method of claim 1, wherein deposition of the sacrificial material occurs on a first region of the substrate surface by non-covalent bonding and deposition of the non-sacrificial material occurs on the second region of the substrate surface by covalent bonding.

7. The method of claim 1, wherein the substantial deposition of the non-sacrificial material on the second region and no substantial deposition of the non-sacrificial material on the sacrificial material on the first region of the substrate has a chemical basis.

8. The method of claim 1, wherein the first and second regions are dielectric and metal, respectively.

9. The method of claim 1, wherein the first and second regions are different dielectrics, respectively.

10. The method of claim 9, wherein the different dielectrics have different dielectric constants.

11. The method of claim 10, wherein the dielectric constant of the first region is lower than the dielectric constant of the second region.

12. The method of claim 11, wherein dielectric constant of the second region is greater by at least a factor of 4 than the dielectric constant of the first region.

13. The method of claim 11, wherein the dielectric of the first region is $SiO_2$ or SiN, and the dielectric of the second regions is $ZrO_2$.

14. The method of claim 1, wherein the sacrificial material is a fluorocarbon ($CF_x$) or a boron oxide ($BO_xCl_y$).

15. The method of claim 1, wherein the non-sacrificial material is a metal.

16. The method of claim 15, wherein the metal is selected from the group consisting of Cu, Al, W, Co and Ti.

17. The method of claim 1, wherein the deposition of the non-sacrificial material is a blanket deposition.

18. The method of claim 1, wherein the selective deposition of the sacrificial material occurs during a periodic etch back/reset operation during which etch residues produced provide some or all of the sacrificial material for the selective deposition.

* * * * *